(12) United States Patent
Stubbs et al.

(10) Patent No.: US 6,597,619 B2
(45) Date of Patent: Jul. 22, 2003

(54) ACTIVELY DRIVEN $V_{REF}$ FOR INPUT BUFFER NOISE IMMUNITY

(75) Inventors: Eric T. Stubbs, Boise, ID (US); James E. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 09/759,499

(22) Filed: Jan. 12, 2001

(65) Prior Publication Data

US 2002/0093868 A1 Jul. 18, 2002

(51) Int. Cl.[7] ............................................... G11C 7/00
(52) U.S. Cl. ............. 365/226; 365/185.21; 365/189.07; 365/206; 365/207
(58) Field of Search ..................... 365/226, 185.21, 365/189.07, 206, 207

(56) References Cited

U.S. PATENT DOCUMENTS

| | | | |
|---|---|---|---|
| 4,006,400 A | 2/1977 | Fett et al. ..................... 323/19 |
| 4,110,677 A | 8/1978 | Boronkay et al. ............. 323/19 |
| 4,270,090 A | 5/1981 | Williams et al. ............. 324/457 |
| 4,399,398 A | 8/1983 | Wittlinger .................... 323/226 |
| 4,477,736 A | 10/1984 | Onishi ......................... 307/297 |
| 4,559,488 A | 12/1985 | Minakuchi ................... 323/281 |
| 4,714,845 A | 12/1987 | Devecchi et al. ........... 307/496 |
| 5,212,440 A | 5/1993 | Waller ........................ 323/313 |
| 5,453,713 A | 9/1995 | Partovi et al. .............. 327/565 |
| 5,481,179 A | 1/1996 | Keeth .......................... 323/315 |
| 5,721,702 A | 2/1998 | Briner ..................... 365/185.21 |
| 5,796,295 A * | 8/1998 | Sharpe-Geisler ............ 327/541 |
| 5,892,402 A * | 4/1999 | Tsubaki et al. ............. 332/288 |
| 5,973,897 A | 10/1999 | Opris et al. .................... 361/56 |
| 6,236,195 B1 * | 5/2001 | Nagatomo ................... 323/303 |
| 6,294,941 B1 * | 9/2001 | Yokosawa ................... 327/309 |
| 6,339,357 B1 * | 1/2002 | Yamasaki et al. ........... 327/538 |
| 6,396,336 B2 * | 5/2002 | Roberts et al. ............. 327/544 |

* cited by examiner

Primary Examiner—David Nelms
Assistant Examiner—Connie C. Yoha
(74) Attorney, Agent, or Firm—TraskBritt

(57) ABSTRACT

A circuit and method for actively driving a reference voltage in a memory device is disclosed. A circuit integrated in a memory device and coupled to an external voltage source substantially eliminates fluctuations in the reference voltage of the memory device caused by power supply changes and noise occurring in the memory device by generating a constant voltage and good current drive from the external voltage source.

34 Claims, 3 Drawing Sheets

ACTIVELY DRIVEN $V_{REF}$ FOR INPUT BUFFER NOISE IMMUNITY

BACKGROUND OF THE INVENTION

1. Field of the Invention

This invention generally relates to a method and apparatus for improving reference voltage stability in semiconductor devices. More specifically, the invention involves the integration of a circuit using a voltage reference to generate a constant voltage with a semiconductor device to actively drive a reference voltage in the device.

2. State of the Art

Semiconductor devices such as logic chips, processors, and memory devices commonly employ at least one voltage reference signal ("$V_{REF}$") for testing and operation. Use of a $V_{REF}$ signal in semiconductor devices is well known in the art. Problems associated with $V_{REF}$ stability caused by variances in a $V_{REF}$ source or noise on the semiconductor device are also well known. For example, a reference voltage generating circuit incorporated into a memory device (e.g. DRAM, SDRAM, or flash memory) generates $V_{REF}$ from a power supply voltage supplied to the memory device. Variations in the power supply voltage are translated to variations in $V_{REF}$. These variations may cause the memory device to operate defectively. Likewise, noise from other signals on the memory device may also cause variations in the generated $V_{REF}$ resulting in similar operational defects.

In other memory devices, such as Rambus and double data rate (DDR) memory, a $V_{REF}$ signal is bused to the device rather than being generated on the device. The bused $V_{REF}$ is subject to the same noise and signal variations as a $V_{REF}$ generated on the device. This results in an equal propensity for operational defects due to $V_{REF}$ fluctuations.

The use of a $V_{REF}$ signal with a semiconductor device is best explained with reference to an example. FIG. 5 is a simplified block diagram illustrating the workings of a memory device 500 such as an SDRAM as known in the art. The memory device 500 includes an address register 510, row address controls 520, column address controls 530, at least one memory array 540, data input/output controls 550, control logic 560 and a $V_{REF}$ generator 570. An external power supply provides a power supply voltage $V_{DD}$ to the memory device 500. To reduce the number of terminals on the memory device, a reference voltage ($V_{REF}$) is created from the power supply voltage $V_{DD}$ rather than from a power supply independent of that producing $V_{DD}$. $V_{DD}$ is introduced to the $V_{REF}$ generator 570 which generates a $V_{REF}$, signal having a desired voltage. For example, the $V_{REF}$ generator 570 may be a voltage divider which produces $V_{REF}$ having half of the voltage of $V_{DD}$. The generated $V_{REF}$ signal is routed to both the address register 510 and the data input/output controls 550 where it is used in the operation of the memory device 500.

A simplistic generalization of $V_{REF}$ operation in a memory device demonstrates some of the problems associated with varying $V_{REF}$ signals. The $V_{REF}$ signal generated from $V_{DD}$ by the $V_{REF}$ generator 570 has a voltage which is approximately half of the power supply voltage $V_{DD}$ applied to the memory device 500. A signal, such as an address signal corresponding to a memory cell location in the memory array 540, received by the memory device 500 at the address register 510, is compared to $V_{REF}$. If the signal has a voltage which is higher than $V_{REF}$, then the signal is high and corresponds to a logical value of one. If the signal has a voltage lower than $V_{REF}$, then the signal is low, having a logical value of zero. In this manner, received signals may be compared to $V_{REF}$ and assigned values which define memory locations within the memory array 540. Similarly, data read from or written to the memory device 500 is compared to $V_{REF}$ to establish whether each data bit is high or low.

Because $V_{REF}$ is usually generated from the power supply voltage $V_{DD}$, variances in the power supply voltage $V_{DD}$ cause fluctuations in $V_{REF}$. If the variance is great enough to drive $V_{REF}$ closer to the power supply voltage $V_{DD}$, a signal received by the memory device 500 which normally would have been defined as high may, instead, be mischaracterized as low. The altered characterization of the signal results in a malfunction of the memory device 500. Similarly, noise created by other circuits and power supplies on the memory device may also cause variances in $V_{DD}$ which in turn cause variances in $V_{REF}$ resulting in the mischaracterization of signals received by the memory device.

To reduce the problems associated with $V_{REF}$ variations in semiconductor devices, integrated circuits and memory devices, numerous $V_{REF}$ regulation circuits have been devised to aid in stabilizing $V_{REF}$. These circuits may be separate from, or coincidental with, the $V_{REF}$ generation circuits for the integrated circuits. One example of a circuit designed to compensate for variation in $V_{REF}$ involves the addition of decoupling capacitors between the power rails of an integrated circuit. The capacitors help eliminate stray capacitance, thereby reducing the amount of noise within the memory device. Similarly, resistive decoupling of noisy nodes within a memory device eliminates noise at the noisy node but enhances noise elsewhere in the circuit. Likewise, diodes are used to reduce the amount of noise in such circuits. Other examples of stabilized $V_{REF}$ generation circuits are described in U.S. Pat. Nos. 5,212,440 and 4,477,736, the disclosures of each of which are hereby incorporated herein by reference. However, these circuits do not eliminate all of the noise in $V_{REF}$.

Although a number of $V_{REF}$ regulation circuits have been described and used with memory devices and other semiconductor devices, problems caused by noise within the device and by fluctuations in power supplies remain. Furthermore, these problems seem to be accentuated in high speed memory devices and other semiconductor devices operating at ever lower voltages. Therefore, it is desirous to provide a $V_{REF}$ to a semiconductor device which is not as susceptible to power supply fluctuations or noise from the circuits in the semiconductor device.

BRIEF SUMMARY OF THE INVENTION

The present invention generally relates to a method and apparatus for improving reference voltage stability in semiconductor devices. More specifically, the invention involves the integration of a circuit using $V_{REF}$ as a reference to generate a constant voltage in a semiconductor device to actively drive a reference voltage ($V_{REF}$) within the memory device. It is understood that, while the present invention may be incorporated with any semiconductor device having need for a $V_{REF}$ signal the present invention will be described in reference to memory device.

According to the present invention, a $V_{REF}$ signal is actively driven on a memory device by coupling an external $V_{REF}$ signal to a circuit capable of generating a constant voltage and active current drive which is integrated with the memory device. For example, employing the combination of an external $V_{REF}$ signal with a voltage follower, a $V_{REF}$ current source substantially close to a constant voltage may be driven within the memory device. Unlike the $V_{REF}$ generated by $V_{REF}$ generators incorporated with semiconductor devices of the prior art, the $V_{REF}$ created by the voltage follower circuit is not subject to fluctuations due to changes in the power supply voltage $V_{DD}$ of the memory device because $V_{REF}$ is driven by an independent, external input voltage. Likewise, the substantially constant voltage driven by the voltage follower reduces the effects of coupling in the memory device and eliminates $V_{REF}$ fluctuations caused by noise in the memory device. Furthermore, the active current drive capability of the voltage follower circuit allows quick responses to other signals coupling $V_{REF}$ or causing fluctuations in $V_{REF}$.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DESCRIPTION OF THE ILLUSTRATED EMBODIMENTS

Illustrated in FIGS. 1 through 4 are different embodiments of the present invention. It is understood that the figures presented in conjunction with this description are not meant to be actual, scaled, representations of the present invention. Instead, FIGS. 1 through 4 exemplify idealized representations of the present invention, employed to more clearly and fully depict the present invention.

Figure 1:
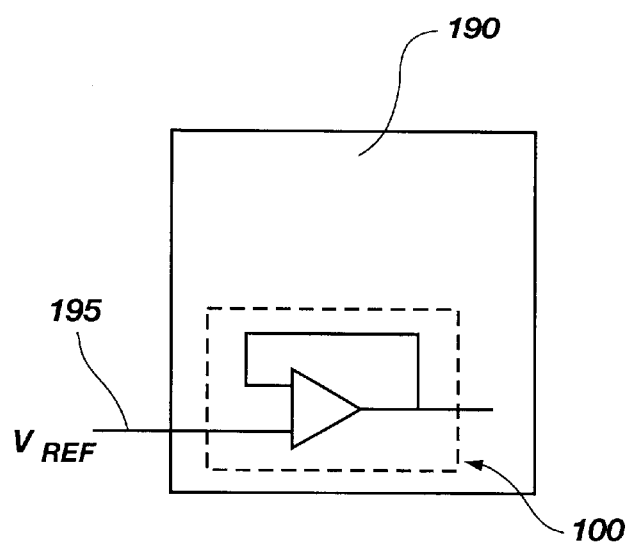
FIG. 1 is a block diagram of a preferred embodiment of the present invention.

FIG. 1 illustrates a general diagram of a preferred embodiment of the present invention: a voltage follower circuit 100 integrated with a semiconductor device 190. The voltage follower circuit 100, delineated by broken lines, is coupled to a $V_{REF}$, source 195 external to the semiconductor device 190.

Figure 2:
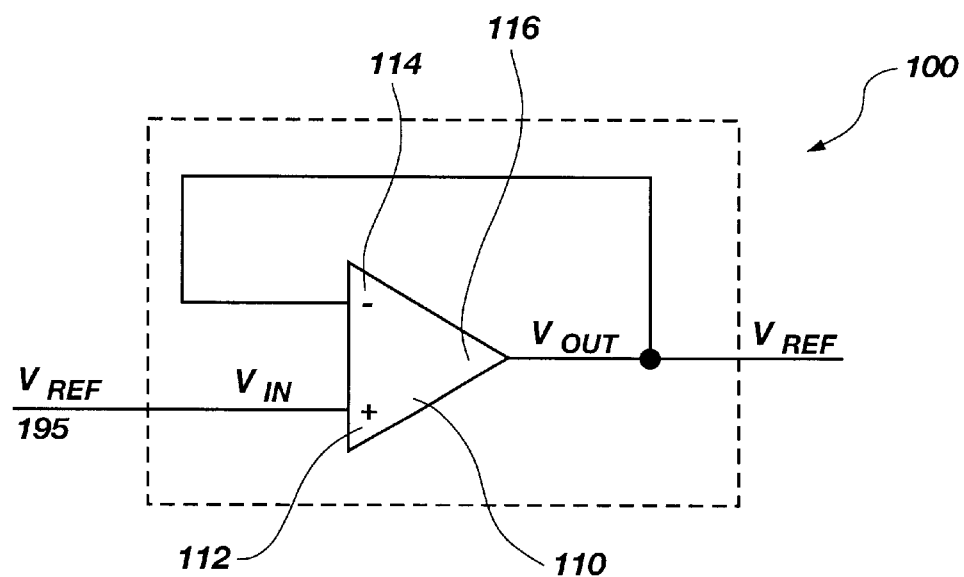
FIG. 2 is a circuit diagram of a voltage follower circuit as used in the present invention.

The voltage follower circuit 100 of FIG. 1 is illustrated in more detail in FIG. 2. As depicted, the voltage follower circuit 100 is delineated by broken lines and includes an operational amplifier 110 having two inputs and an output. A first input, commonly known as a non-inverting input 112, couples a voltage signal $V_{IN}$ to the amplifier 110. The second input, also known as the inverting input 114, is coupled to the output 116 of the amplifier 110. Thus, the inverting input 114 receives a voltage signal $V_{OUT}$.

The voltage follower circuit 100 illustrated in FIG. 2 is well known in the art. The voltage $V_{IN}$ applied to the non-inverting input 112 produces a voltage $V_{OUT}$ which is coupled to the inverting input 114, producing a second input to the voltage follower circuit of $V_{OUT}$. Voltage follower circuits such as that illustrated in FIG. 2 actively drive $V_{OUT}$ equal to $V_{IN}$, thereby maintaining a substantially constant voltage $V_{OUT}$.

In this embodiment of the present invention, the non-inverting input 112 of the voltage follower circuit 100 is coupled to a $V_{REF}$ source 195 external to the semiconductor device 190. Therefore, $V_{IN}$ is equal to the $V_{REF}$ source 195. Coupled with $V_{OUT}$, the voltage follower circuit 100 generates a $V_{REF}$ for the semiconductor device 190 which is independent of the semiconductor device power supply (not shown). Thus, fluctuations in $V_{REF}$ due to power supply variations are eliminated. Additionally, the voltage follower circuit 100 generates a $V_{REF}$ having sufficient current to counter at least a portion of the capacitive coupling effects commonly found on the $V_{REF}$ line in semiconductor devices having noisy environments. The ability of the voltage follower circuit 100 to actively drive $V_{REF}$ in the semiconductor device 190 reduces fluctuations in $V_{REF}$ caused by noise and interference encountered by $V_{REF}$ within the semiconductor device 190.

Figure 3:
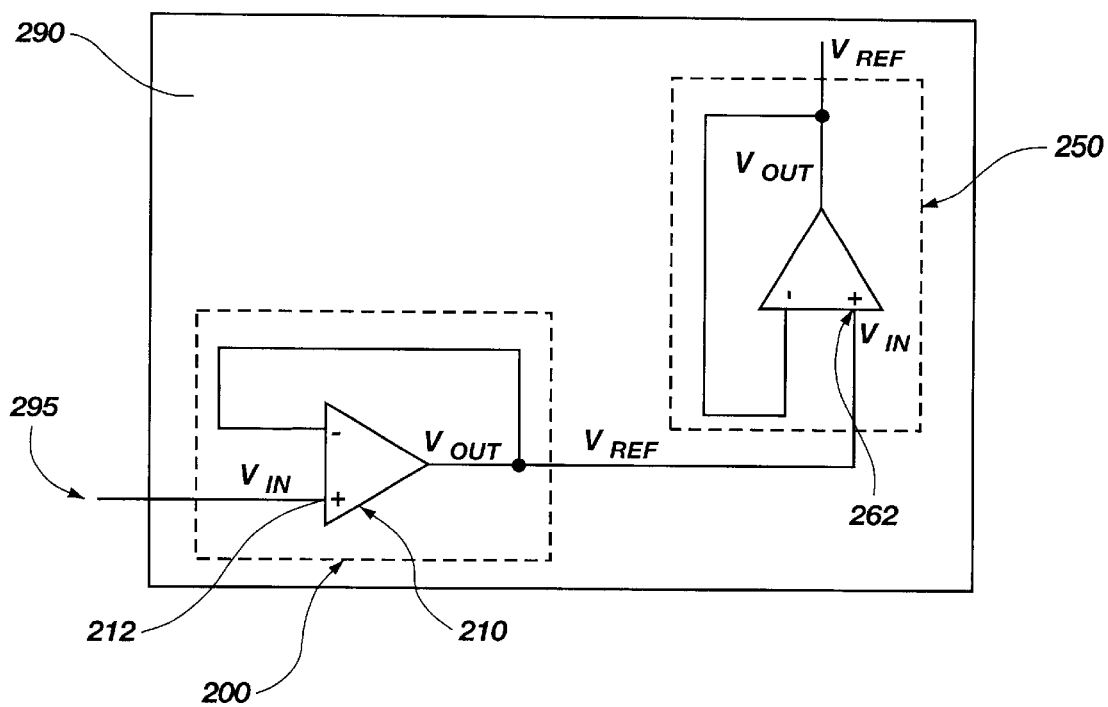
FIG. 3 is a block diagram of an additional embodiment of the present invention.

In another embodiment of the invention, multiple voltage follower circuits 100 are integrated with a semiconductor device along the $V_{REF}$ line, thereby assuring that the advantages of the voltage follower circuit 100 are realized with the $V_{REF}$ throughout the semiconductor device. For example, FIG. 3 illustrates a semiconductor device 290 having a first voltage follower circuit 200 and a second voltage follower circuit 250 integrated therein. A voltage source 295 external to the semiconductor device 290 is the non-inverted input 212 of the amplifier 210 of the first voltage follower circuit 200. $V_{OUT}$ is $V_{REF}$ for a first circuitry portion (not shown) of the semiconductor device 290. $V_{REF}$ exits the first circuitry portion of the semiconductor device 290 after having been exposed to the noise generated by the circuits therein. Although the $V_{REF}$ is driven by the first voltage follower circuit 200, a second voltage follower circuit 250 receives the $V_{REF}$ at the non-inverted input 262 of the second amplifier 260. The second voltage follower circuit 250 drives a second $V_{REF}$ to a second circuitry portion (not shown) of the semiconductor device 290. In this manner, the advantages of using a voltage follower circuit may be realized throughout the entire memory device.

It is further understood that the present invention is not limited to the use of one or two voltage follower circuits to drive $V_{REF}$ in a semiconductor device. A larger plurality of voltage follower circuits could be incorporated with the $V_{REF}$ signal in a semiconductor device in accordance with the present invention. Likewise, the present invention is not limited by the type or configuration of the voltage follower circuit or circuits integrated with the semiconductor device. Voltage follower circuits are well known in the art and one of ordinary skill in the art would understand how to integrate a chosen voltage follower circuit with the chosen semiconductor device. Furthermore, the present invention is not limited to the incorporation of voltage follower circuits with a semiconductor device. Any circuit that uses $V_{REF}$ as a reference to generate a substantially constant voltage and good current drive may be substituted for the voltage follower circuits described herein.

The present invention is not limited to particular semiconductor devices. The advantages realized by use of this invention may be incorporated into memory devices, including, for example, DRAM, SDRAM, Rambus memory, double data rate memory, flash memory, and other high speed memory devices, as well as logic chips, processors and other integrated circuit chips.

Figure 4:
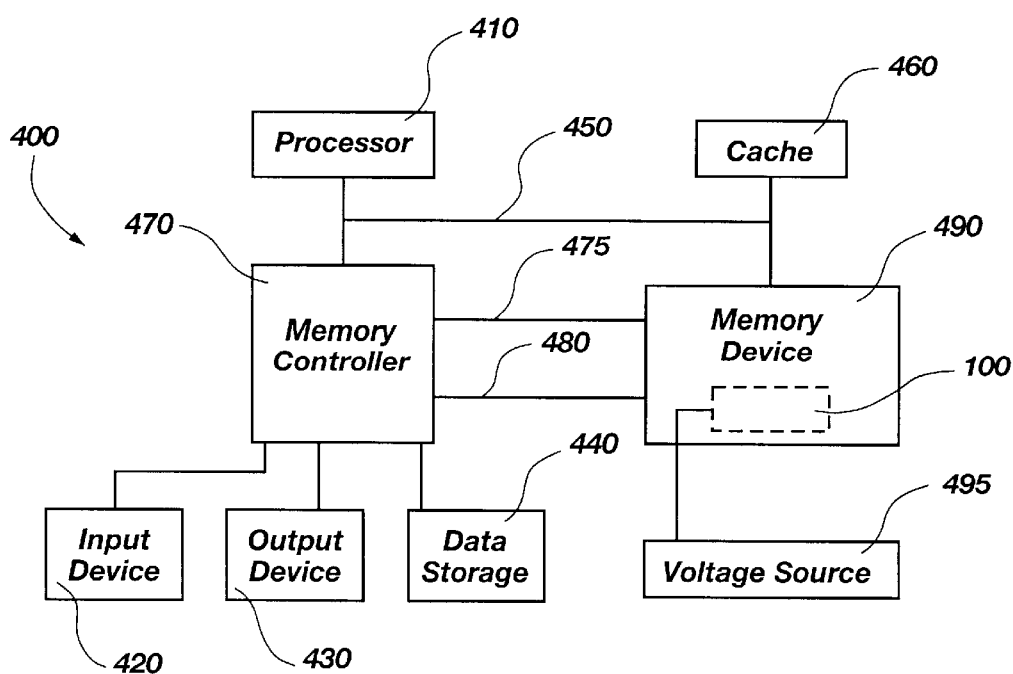
FIG. 4 is a block diagram of a computer system using a memory device of the present invention.
Figure 5:
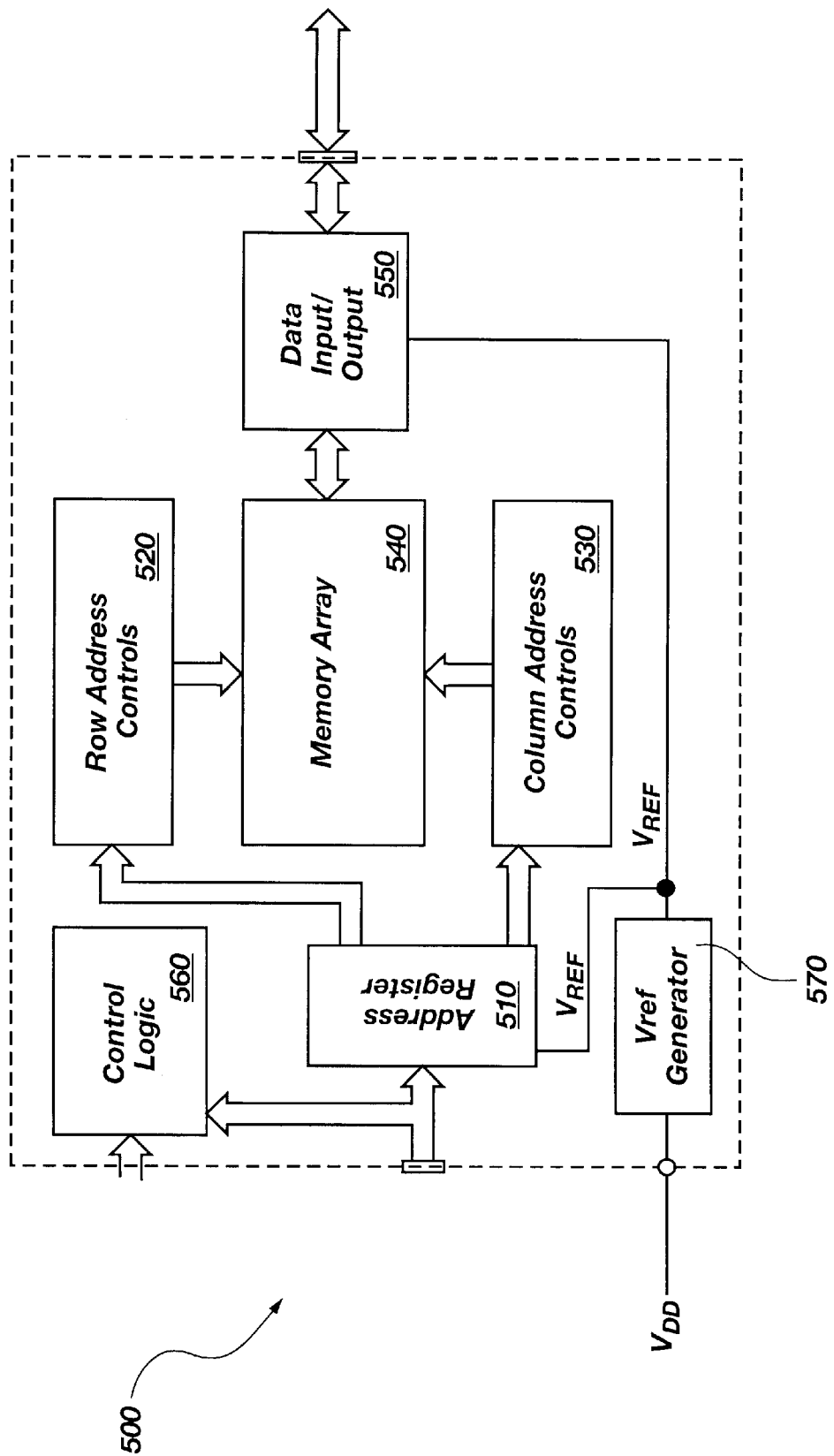
FIG. 5 is a simplified block diagram of a memory device of the prior art employing a $V_{REF}$ signal created from a power supply voltage.

FIG. 4 illustrates a block diagram of a computer system 400 that includes at least one memory device 490 incorporating the embodiments of the present invention as described with respect to FIGS. 1 through 3 above. As illustrated, the computer system 400 includes a processor 410 for performing computing functions as known in the art, one or more input devices 420 as known in the art, and one or more output devices 430. One or more data storage devices 440 may also be coupled to the computer system to allow the processor 410 to store or retrieve data. The processor 410 includes a processor bus 450 that includes an address bus, a control bus, and a data bus. The processor 410 is also coupled to a cache memory 460 and to the memory device 490 through a memory controller 470. A data bus is also coupled between the memory device 490 and the processor bus 450. The memory controller 470 includes a control bus 475 and an address bus 480 coupled to the memory device 490. A voltage source 495 is also coupled to the memory device 490 to provide a $V_{REF}$ to at least one circuit 100 integrated with the memory device 490 to generate a $V_{REF}$ on the device 490 having a constant voltage and a good current drive.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. A method of reducing noise interference to a reference voltage in a semiconductor device configured to electrically operate from a power supply voltage, comprising:
   introducing a reference voltage to a circuit integrated with said semiconductor device, said reference voltage external to said semiconductor device and independent of said power supply voltage; and
   generating a voltage reference source independent of said power supply voltage from said reference voltage introduced to said circuit, said voltage reference source having a substantially constant voltage.

2. The method of claim 1, wherein said introducing said reference voltage to a circuit comprises coupling said reference voltage to a non-inverting input of a voltage follower circuit.

3. The method of claim 1, wherein generating a voltage reference source having a substantially constant voltage further comprises:
   coupling said reference voltage to a non-inverting input of a voltage follower circuit;
   coupling an output voltage from said voltage follower circuit to an inverting input of said voltage follower circuit; and
   generating said output voltage from said reference voltage coupled to said non-inverting input and said output voltage from said voltage follower circuit coupled to said inverting input of said voltage follower circuit, wherein said output voltage from said voltage follower circuit is said voltage reference source.

4. The method of claim 1, wherein generating a voltage reference source from said reference voltage introduced to said circuit further comprises generating a voltage reference source having sufficient current to counter at least a portion of capacitive coupling effects on said voltage reference source in said semiconductor device.

5. The method of claim 1, further comprising generating a second voltage reference source having a substantially constant voltage from said voltage reference source.

6. The method of claim 5, wherein generating a second voltage reference source having a substantially constant voltage comprises:
   introducing said voltage reference source to a second circuit integrated with said semiconductor device; and
   generating said second voltage reference source with said second circuit.

7. The method of claim 6, wherein said introducing said voltage reference source to said second circuit comprises coupling said voltage reference source to a non-inverting input of a voltage follower circuit.

8. The method of claim 5, wherein generating a second voltage reference source having a substantially constant voltage from said voltage reference source further comprises:
   coupling said voltage reference source to a non-inverting input of a voltage follower circuit;
   coupling an output voltage from said voltage follower circuit to an inverting input of said voltage follower circuit; and
   generating said output voltage from said voltage follower circuit, wherein said output voltage from said voltage follower circuit is said second voltage reference source.

9. A circuit for actively driving a reference voltage in a memory device, comprising:
   a memory device configured to electrically operate from a power supply voltage;
   a reference voltage source external to said memory device and independent of said power supply voltage; and
   a circuit integrated with said memory device and operably coupled to said reference voltage source to drive a reference voltage independent of said power supply voltage in said memory device.

10. The circuit of claim 9, wherein said circuit integrated with said memory device and operably coupled to said reference voltage source is a voltage follower circuit.

11. The circuit of claim 9, wherein said memory device is a high speed memory device.

12. The circuit of claim 9, wherein said memory device is selected from the group of memory devices consisting of DRAM, SDRAM, Rambus memory, double data rate memory, and flash memory.

13. The circuit of claim 9, further comprising a second circuit integrated in said memory device and operably coupled to said reference voltage to drive a serially-coupled second reference voltage in said memory device.

14. The circuit of claim 13, wherein said second circuit is a voltage follower circuit.

15. The circuit of claim 9, wherein said circuit comprises a plurality of serially-coupled voltage follower circuits integrated with said memory device and operably coupled to said reference voltage source to drive a reference voltage in said memory device.

16. A circuit for actively driving a reference voltage in a semiconductor device, comprising:
   a semiconductor device configured to electrically operate from a power supply voltage;
   a voltage source external to said semiconductor device and independent of said power supply voltage; and
   a circuit integrated with said semiconductor device and operably coupled to said voltage source to drive a reference voltage independent of said power supply voltage in said semiconductor device.

17. The circuit for actively driving a reference voltage in a semiconductor device of claim 16, wherein said circuit integrated with said semiconductor device and operably coupled to said voltage source is a voltage follower circuit.

18. The circuit of claim 16, further comprising a second circuit integrated in said semiconductor device and operably coupled to said reference voltage to drive a serially-coupled second reference voltage in said semiconductor device.

19. The circuit of claim 18, wherein said second circuit is at least one voltage follower circuit.

20. The circuit of claim 19, wherein said at least one voltage follower circuit comprises a plurality of voltage follower circuits integrated with said semiconductor device and operably coupled to said voltage source to drive a reference voltage in said semiconductor device.

21. The circuit of claim 16, wherein said semiconductor device is a semiconductor device selected from the group consisting of memory devices, logic circuits, and processors.

22. A computer system comprising:
   a processor;
   a memory controller coupled to said processor;
   a memory device configured to electrically operate from a power supply voltage and operably coupled to said processor through said memory controller;
   a circuit integrated with said memory device to actively drive a reference voltage independent of said power supply voltage in said memory device; and
   a voltage source external to said memory device and independent of said power supply and operably coupled to said circuit.

23. The computer system of claim 22, wherein said circuit integrated with said memory device is a voltage follower circuit.

24. The computer system of claim 22, further comprising at least one input device operably coupled to said processor.

25. The computer system of claim 22, further comprising at least one output device operably coupled to said processor.

26. The computer system of claim 22, further comprising a data storage device operably coupled to said processor.

27. The computer system of claim 22, further comprising a second circuit integrated with said memory device for actively driving a serially-coupled second reference voltage in said memory device.

28. The computer system of claim 27, wherein said second circuit comprises a voltage follower circuit.

29. A method of actively driving a reference voltage in a memory device configured to electrically operate from a power supply voltage, comprising:
   introducing a voltage source to a circuit integrated with said memory device wherein said voltage source originates externally to said memory device and independent of said power supply voltage; and
   using said circuit to produce an actively driven reference voltage independent of said power supply voltage in response to said voltage source.

30. The method of claim 29, further comprising configuring said circuit as a voltage follower circuit.

31. The method of claim 29, further comprising:
   introducing said actively driven reference voltage to a second circuit integrated with said memory device; and
   using said second circuit to produce a second actively driven reference voltage in response to said actively driven reference voltage.

32. The method of claim 30, wherein said introducing said voltage source to said circuit comprises coupling said voltage source to a non-inverting input of said voltage follower circuit.

33. The method of claim 29, wherein using said circuit to produce an actively driven reference voltage further comprises:
   coupling said voltage source to a non-inverting input of a voltage follower circuit;
   coupling an output voltage from said circuit to an inverting input of said voltage follower circuit; and
   producing said output voltage from said non-inverting input of said voltage follower circuit and said inverting input of said voltage follower circuit, wherein said output voltage is said actively driven reference voltage.

34. The method of claim 33, wherein producing said output voltage from said non-inverting input of said voltage follower circuit and said inverting input of said voltage follower circuit comprises producing an output voltage having a substantially constant voltage and sufficient current to counter at least a portion of any capacitive coupling effects exhibited in said external voltage.

* * * * *

UNITED STATES PATENT AND TRADEMARK OFFICE
CERTIFICATE OF CORRECTION

PATENT NO. : 6,597,619 B2
DATED : July 22, 2003
INVENTOR(S) : Eric T. Stubbs and James E. Miller It is certified that error appears in the above-identified patent and that said Letters Patent is hereby corrected as shown below:

Column 1,
Line 51, change "$V_{REF}$," to -- $V_{REF}$ --
Line 59, change "$V_{REF}$signals" to -- $V_{REF}$ signals --

Column 3,
Line 49, change "$V_{REF}$," to -- $V_{REF}$ --

Column 5,
Lines 41, 56 and 65, change "a" to -- said --

Column 6,
Line 9, change "a" to -- said --
Line 43, insert -- source -- between "voltage" and "to"

Signed and Sealed this

Eighth Day of February, 2005

JON W. DUDAS
*Director of the United States Patent and Trademark Office*